United States Patent [19]

Williams et al.

[11] Patent Number: 5,063,357

[45] Date of Patent: Nov. 5, 1991

[54] STABLE, RELIABLE OSCILLATOR SYSTEM USING AUTOMATIC OSCILLATOR SUBSTITUTION

[75] Inventors: William R. Williams, N. Lauderdale; Edgar H. Callaway, Jr., Boca Raton, both of Fla.

[73] Assignee: Motorola, Inc., Schaumburg, Del.

[21] Appl. No.: 562,361

[22] Filed: Aug. 3, 1990

[51] Int. Cl.$^5$ .............................................. H03L 7/00
[52] U.S. Cl. ........................................ 331/49; 455/75; 455/119
[58] Field of Search ....................... 331/49, 2; 307/219; 328/61, 104; 340/292; 455/76, 119, 258, 259, 75

[56] References Cited

U.S. PATENT DOCUMENTS

| | | | |
|---|---|---|---|
| 3,329,905 | 7/1967 | Niertit et al. | 331/49 |
| 4,514,706 | 4/1985 | Thompson | 331/16 |
| 4,583,054 | 4/1986 | Basile | 331/49 X |

*Primary Examiner*—Siegfried H. Grimm
*Attorney, Agent, or Firm*—Daniel K. Nichols

[57] ABSTRACT

A high stability oscillator circuit 100 having an output 150 and a multiple of reference oscillators 102, 104, and 106 for enhanced stability and reliability is disclosed. The output signals of these oscillators 108, 110, and 112 are mixed and analyzed for determination of excessive frequency shift including component failure. Additionally a switch 148 decouples the shifted oscillator signal from the output of the circuit 150 and couples another one of the oscillators in its place.

10 Claims, 5 Drawing Sheets

STABLE, RELIABLE OSCILLATOR SYSTEM USING AUTOMATIC OSCILLATOR SUBSTITUTION

TECHNICAL FIELD

This invention relates generally to oscillator circuits and more specifically to reference oscillator circuits and is particularly directed toward circuits with more than one reference oscillator.

BACKGROUND

Devices using oscillator circuits have often depended on compensation circuits to minimize frequency shifts due to variations in the ambient temperature. Manufacturers have also used shock absorbent pads and other similar methods to alleviate the effects of mechanical shock. While these methods have proven effective in reducing minor frequency changes, a solution is not available to remedy substantial shift and perhaps total failure.

In radio communication devices where compliance with regulations set forth by various communication agencies is mandatory for operation, much less frequency shift is tolerable. Indeed operation of such devices is prohibited beyond a certain frequency shift.

In many situations the users of radio communication devices lose contact with the base or other users due to substantial frequency shift or component failure in the oscillator circuit without any prior notification. This loss of contact may prove detrimental and even hazardous in applications such as the public safety market.

Accordingly, a need exists for a method to recognize significant frequency shift in oscillator circuits and to prevent the total failure of the devices containing such circuits due to such shifts.

SUMMARY OF THE INVENTION

Briefly, according to the invention, a high stability oscillator circuit having an output and a plurality of reference oscillators for enhanced stability and reliability is disclosed. The output signals of these oscillators are mixed in pairs. The resulted signals are subsequently filtered and converted to voltage levels corresponding to their frequencies. Such voltage levels are finally presented to a controller for analysis.

As part of its analysis, the controller compares the voltages applied to its input for determination of excessive frequency shift of the oscillator circuits including component failure. Upon confirmation of substantial frequency shift a switch decouples the shifted oscillator signal from the output of the circuit and couples another one of the oscillators in its place. Additionally the controller informs the user of the signal switching so that remedial action could be taken.

DETAILED DESCRIPTION OF THE PREFERRED EMBODIMENT

Figure 1:
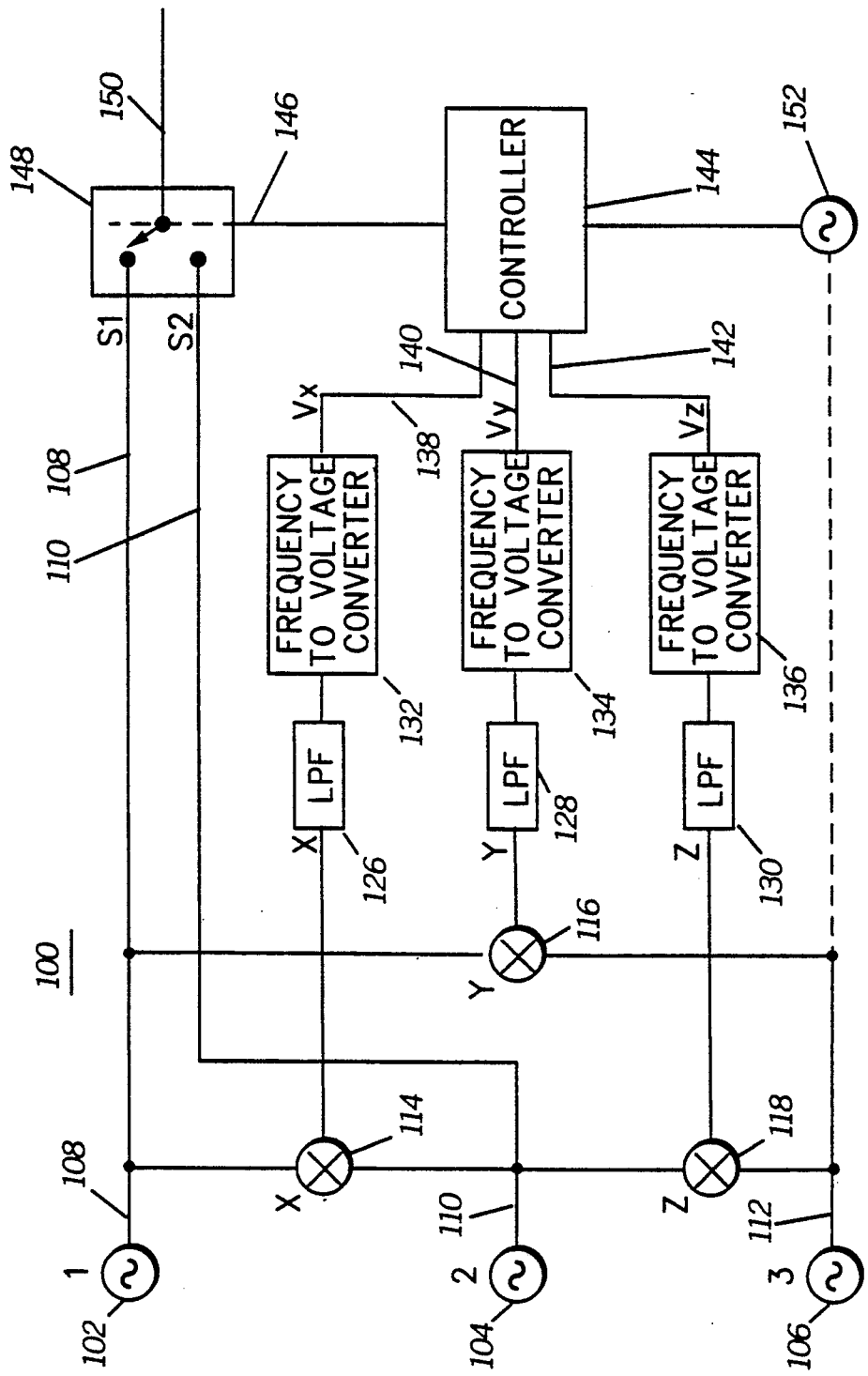
FIG. 1 is a block diagram of a multi oscillator circuit in accordance with the present invention.

Referring now to FIG. 1, the oscillator circuit can be seen as preferably depicted by the numeral 100. The oscillator circuit 100 includes generally 3 oscillators, preferably crystal reference oscillators 102, 104, and 106, three mixers 114, 116, and 118, three low pass filters 126, 128, and 130, and three frequency to voltage converters 132, 134, and 136. In addition, a controller 144 and a switch 148 configured in conjunction with the three oscillators 102, 104, and 106.

The output of oscillator 102 is connected to the first inputs of mixers 116 and 114 via signal line 108. The output of oscillator 104 is connected to the second input of mixer 114 and the first input of mixer 118 via signal line 110. The output of oscillator 106 is connected to the second inputs of mixers 118 and 116 via signal line 112.

The outputs of the mixers 114, 116, and 118 are signals having the frequencies of the sums and the differences of their respective inputs. Ideally the three oscillators 102, 104, and 106 operate at identical frequencies. This condition forces the outputs of the low pass filters 126, 128, and 130 to rest at a DC voltage corresponding to the phase differential of the crystal oscillators 102, 104, and 106. In practical circuits the three oscillators 102, 104, and 106 do not operate at exactly the same frequencies and therefore produce a frequency differential at the outputs of low pass filters 126, 128, and 130. This initial condition is treated at the controller 144 accordingly.

The output signal of mixer 114 comprises the sum and difference of the outputs of oscillators 102 and 104 which signal is provided to the input of low pass filter 126. This filter removes the high frequency components of said signal. Therefore the output of the filter 126 is the difference of the outputs of oscillators 102 and 104. Similarly the output of low pass filter 128 is the difference of the output signals of oscillators 102 and 106 and the output of low pass filter 130 is the difference of the output signals of oscillators 104 and 106.

The low pass filters 126, 128, and 130 are then coupled to a series of frequency to voltage converters 132, 134, and 136. The outputs of these converters are voltages corresponding to the frequencies of the signals applied to them.

The output signals of frequency to voltage converters 132, 134, and 136 are coupled to a controller 144 via signal lines $V_x$, $V_y$, and $V_z$ respectively. The controller analyzes these voltages to determine which oscillator has shifted excessively or failed. Upon such analysis the control line 146 is actuated appropriately to decouple the shifted or failed oscillator from the output line of the circuit 150 and couple the other operating one in its place.

Those skilled in the art will appreciate that additional oscillators, mixers, filters, and converters could be utilized to achieve higher reliability.

Figure 2:
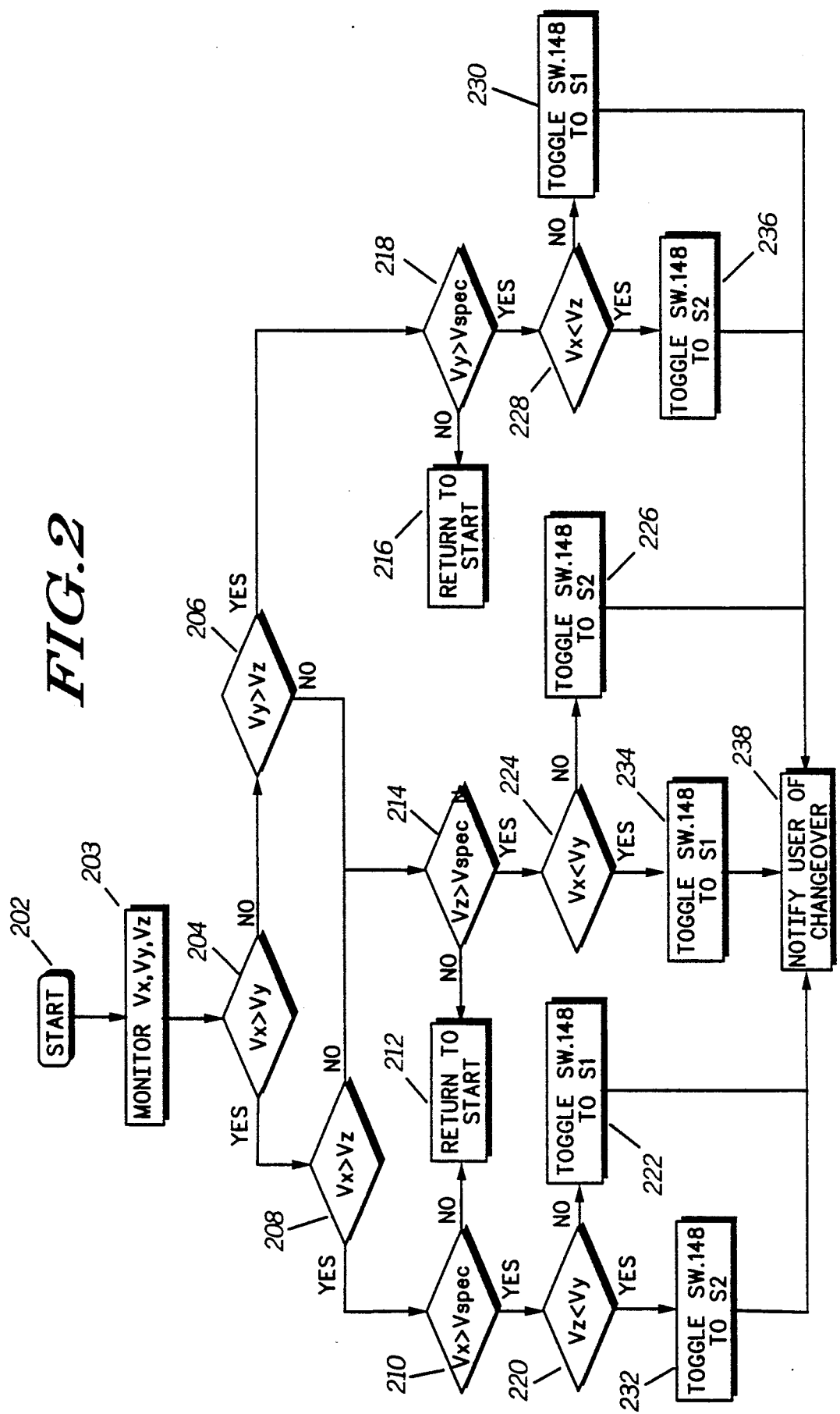
FIG. 2 is a detailed flow chart of the implementation of the controller of the preferred embodiment.

FIG. 2 shows the operation of the controller 144 in monitoring the frequencies of oscillators 102, 104, and 106. This flow chart is a sample procedure for such controller 144 using a voting scheme.

From the start block 202 $V_x$, $V_y$, and $V_z$ the outputs of frequency to voltage converters 132, 134, and 136 are monitored. The monitor $V_x$, $V_y$, and $V_z$ block 203 is connected to a decision block 204 labeled $V_x > V_y$. The YES output of decision block 204 is connected to another decision block 208 labeled $V_x > V_z$. The YES output of decision block 208 indicates that Vx is the maximum of the three voltages $V_x$, $V_y$, and $V_z$ and therefore one of the two oscillators 102 or 104 has shifted in frequency more than the oscillator 106.

The YES output of the decision block 208 is connected to a decision block 210. This decision block 210 compares $V_x$ against a specified and allowable voltage Vspec. In effect decision block 210 evaluates the detected frequency shift against an allowed and specified value. The NO output of decision block 210 is connected to a return to start block 212 indicating the frequency shift is within a specified range.

The YES output of decision block 210 is connected to yet another decision block 220 labeled $V_z < V_y$. The decision block 220 compares $V_z$ and $V_y$ and concludes which of oscillators 102 and 104 has shifted in frequency more than the other.

The YES output of decision block 220 is connected to the input of block 232. The block 232 toggles switch 148 from S1 to S2 connecting signal line 110 to the circuit output line 150. This action decouples oscillator 102 from the circuit output line 150 and couples oscillator 104 in its place.

The NO output of decision block 220 is connected to the input of block 222. The block 222 toggles switch 148 from S2 to S1 connecting signal line 108 to the circuit output line 150. This action decouples oscillator 104 from the circuit output line 150 and couples oscillator 102 in its place.

Similarly excessive frequency shifts or failures of oscillators 104 and 106 are detected by other blocks of the flow chart 200 and switch 146 is toggled accordingly.

Those skilled in the art appreciate the availability of other procedures to achieve similar results. The presentation of this procedure should be construed only as an example (and not as a limitation) to further clarify the preferred embodiment of the present invention.

Optionally, the oscillator 106 can be eliminated. The second input to the mixer 118 is provided for by the oscillator 152. The use of the oscillator 152 as a mixing signal to the mixer 118 reduces the oscillator count thereby reducing the space and cost requirements. This embodiment, however, does not protect against slow frequency drifts and can only detect sharp frequency failures. The signal flow remains identical to the method of the preferred embodiment described above. Furthermore, the controller requires memory in this optional embodiment.

Figure 3:
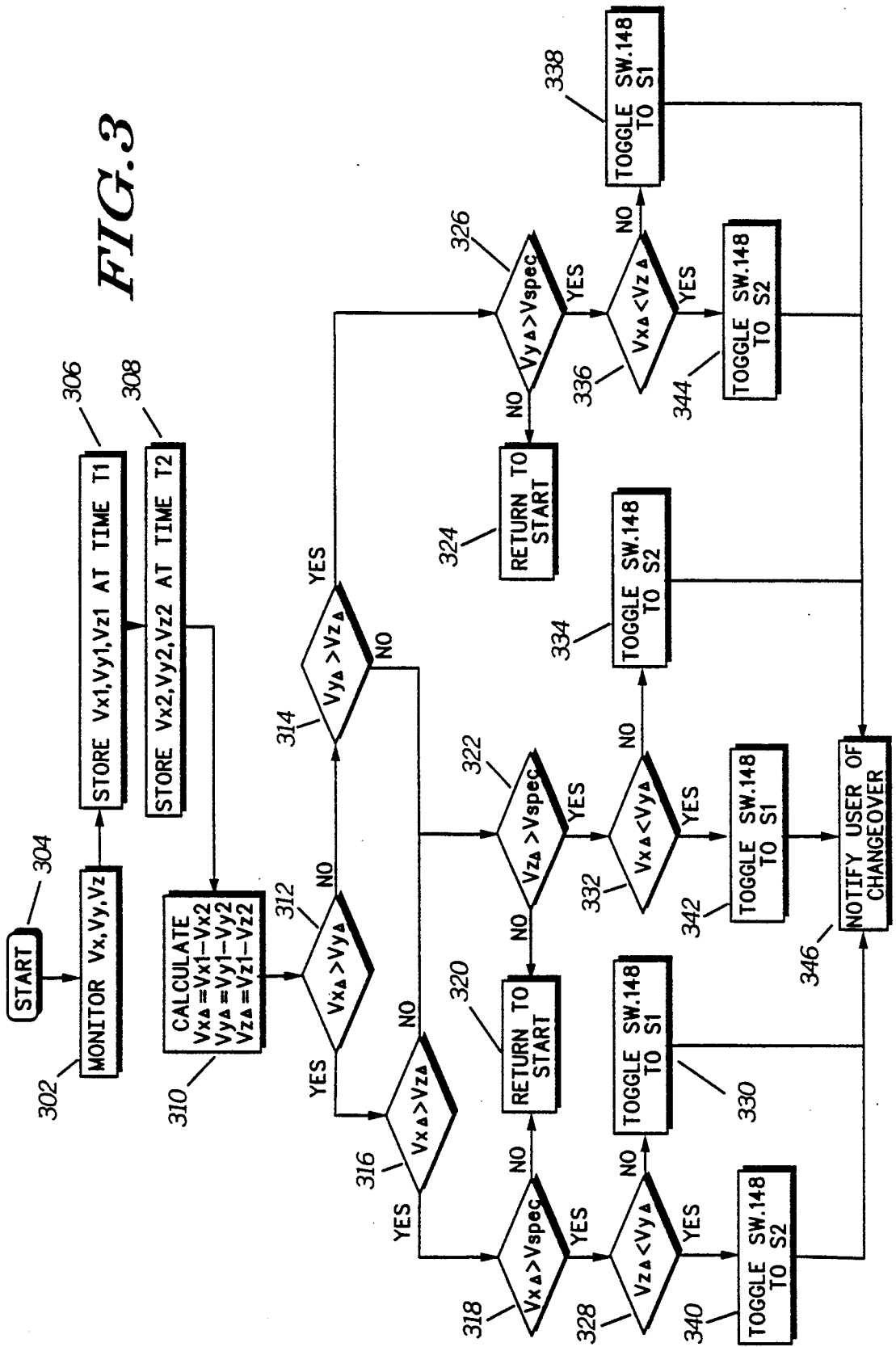
FIG. 3 is a detailed flow chart of the implementation of the controller of an optional embodiment.

FIG. 3 shows the operation of the controller 144 in monitoring the frequencies of oscillators 102, 104, and 152. This flow chart is a sample procedure for such controller.

From the start block 302 $V_x$, $V_y$, and $V_z$ the outputs of frequency to voltage converters 132, 134, and 136 are monitored. The monitor $V_x$, $V_y$, and $V_z$ block 304 is connected to a store $V_{x1}$, $V_{y1}$, $V_{z1}$ at T1 block 306 which has its output connected to a store $V_{x2}$, $V_{y2}$, $V_{z2}$ at time T2 block 308. The output of block 308 is coupled to a calculate voltage differential block 310. At this point the three voltages $V_x$, $V_y$, and $V_z$ have been stored at t1 and t2 intervals and their differences $V_{x\Delta}$, $V_{y\Delta}$, and $V_{z\Delta}$ calculated.

The output of the calculate block 310 is connected to a decision block 312 labeled $V_{x\Delta} > V_{y\Delta}$. The YES output of decision block 312 is connected to another decision block 316 labeled $V_{x\Delta} > V_{z\Delta}$. The YES output of decision block 316 indicates that $V_{x\Delta} > V_{y\Delta} > V_{z\Delta}$ and therefore one of the two oscillators 102 or 104 has shifted in frequency.

The YES output of the decision block 316 is connected to a decision block 318 labeled $V_{x\Delta} > V_{spec}$. The decision block 318 compares $V_{x\Delta}$ against a specified and allowable voltage $V_{spec}$. In effect decision block 318 evaluates the detected frequency shift against an allowed and specified value. The NO output of decision block 318 is connected to a return to start block 320 indicating the frequency shift is within a specified range.

The YES output of decision block 318 is connected to yet another decision block 328 labeled $V_{z\Delta} < V_{y\Delta}$. The decision block 328 compares $V_{z\Delta}$ and $V_{y\Delta}$ and concludes which of oscillators 102 and 104 has shifted in frequency more than the other.

The YES output of decision block 328 is connected to the input of block 340. The block 340 toggles switch 148 from S1 to S2 connecting signal line 110 to the circuit output line 150. This action decouples oscillator 102 from the circuit output line 150 and couples oscillator 104 in its place.

The NO output of decision block 328 is connected to the input of block 330. The block 330 toggles switch 148 from S2 to S1 connecting signal line 108 to the circuit output line 150. This action decouples oscillator 104 from the circuit output line 150 and couples oscillator 102 in its place.

Similarly excessive frequency shifts or failures of oscillators 104 or 106 are detected by other blocks of the flow chart 300 and switch 146 is toggled accordingly.

Those skilled in the art appreciate the availability of several other procedures to achieve similar results. The presentation of this procedure should be construed only as an example (and not as a limitation) to further clarify the optional embodiment of the present invention.

Figure 4:
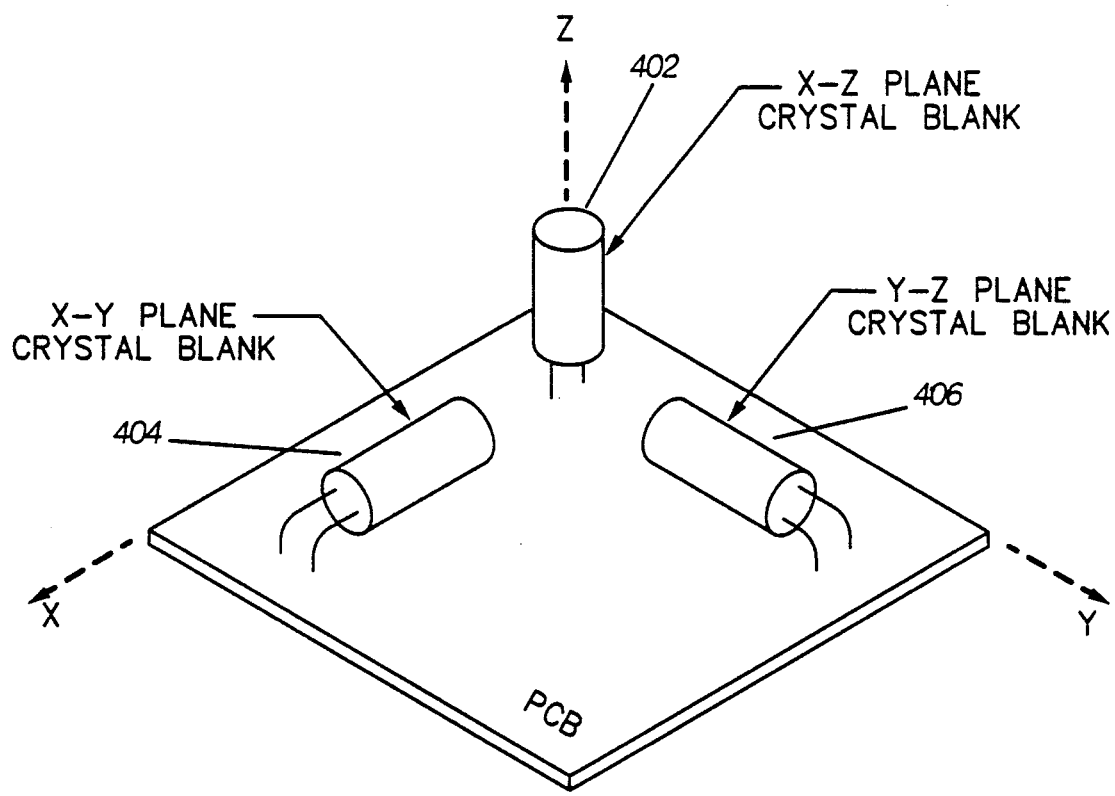
FIG. 4 is a diagram of the positioning of the oscillator of the preferred embodiment.

Referring now to FIG. 4 a preferred orientation of the crystal reference oscillators is shown. The crystals 402, 404, and 406 are mounted in three mutually perpendicular planes. The crystal blanks inside the packages lie in the planes of the attachment leads. Such orientation greatly reduces the likelihood of multiple oscillator failures due to a sudden impact.

Figure 5:
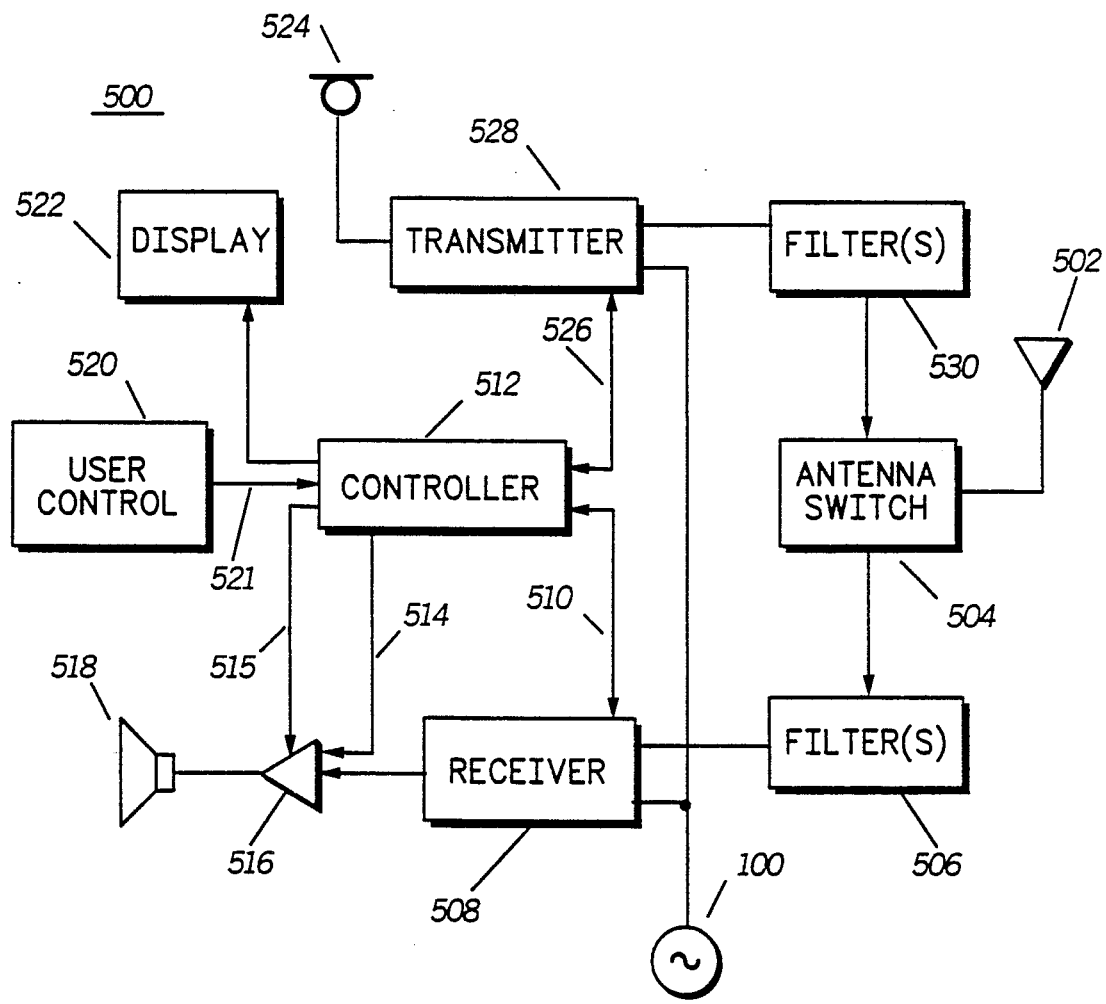
FIG. 5 is a block diagram of a communication device in accordance with the present invention.

Referring to FIG. 5, a radio communication device 500 in accordance with the present invention includes an antenna switch 504 that can selectively couple the antenna 502 to either a receiver 508 via filter(s) 506 or a transmitter 528 via filter(s) 530. The Oscillator 100 provides a reference frequency signal to the radio communication device 500.

To receive a message, a radio frequency signal is routed from an antenna 502 to a receiver 508 via the antenna switch 504 and a filter(s) 506. The receiver 508 may be of conventional design. The receiver 508 provides data messages to the controller 512 via data line 510. Typically, the controller 512 operates to alert the radio user and present a received message in a variety of ways depending upon the message type and optional features that may be enabled or disabled by the radio user. Thus the controller 512 may send an alert signal to an amplifier 516, via data line 514, to be presented to the radio operator via the speaker 518. After the alert, a voice message may be provided by the receiver 508 to the amplifier 516 for presentation via the speaker 518. Data messages would follow the radio's address code to the controller 512 via data line 510. Such messages are subsequently analyzed by the controller 510 and if appropriate sent to a display 522 for presentation.

Optionally the present invention can be applied to the transmitter section 528 of the radio communication device 500. To transmit a signal, a voice message is routed from the microphone 524 to the transmitter 528 for transmission via the antenna 502 through filter(s) 530 and antenna switch 504. Data messages are processed by the controller 512 and are subsequently presented to the transmitter 528 for transmission via the antenna 502 through filter(s) 530 and antenna switch 504.

Those skilled in the art will recognize that various modifications and changes could be made with respect to the above described invention, without departing from the spirit and scope of the invention as set forth. Therefore, it should be understood that the claims are not to be considered as limited to the particular embodiments set forth in the absence of specific limitations expressly incorporating such embodiments.

We claim:

1. A high reliability and high stability oscillator circuit having an output, comprising:
    at least three oscillators each providing oscillator signals;
    at least three mixers each coupled to a pair of oscillators for mixing pairs of said oscillator signals to provide mixed signals; and
    detector means responsive to said mixed signals for detecting frequency shift in any one of the oscillators;
    switching means responsive to said detector means to provide one of said oscillator signals to the output of said oscillator circuit.

2. The high stability oscillator circuit of claim 1, wherein said oscillators are reference oscillators.

3. The high stability oscillator circuit of claim 1 wherein said oscillators are crystal reference oscillators.

4. A high reliability and high stability oscillator circuit having an output, comprising:
    a plurality of oscillators oriented mutually perpendicular and providing oscillator signals;
    mixing means for mixing pairs of said oscillator signals to provide mixed signals; and
    switching means responsive to said mixed signals to provide one of said oscillator signals to the output of said circuit.

5. A communication device, comprising:
    a transceiver circuit for receiving and transmitting radio frequency signals having:
    a high stability oscillator circuit having an output, including:
    at least three oscillators each providing oscillator signals;
    at least three mixers each coupled to a pair of oscillators for mixing pairs of said oscillator signals to provide mixed signals; and
    detector means responsive to said mixed signals for detecting frequency shift in any one of the oscillators;
    switching means responsive to said detector means to provide one of said oscillator signals to the output of said oscillator circuit.

6. The communication device of claim 5, wherein said oscillators are reference oscillators.

7. The communication device of claim 6, wherein said reference oscillators are crystal reference oscillators.

8. A communication device as defined in claim 5, wherein said plurality of oscillators are oriented mutually perpendicular.

9. A communication device as defined in claim 5, further including controller means for controlling the functions of said communication device.

10. The communication device of claim 9, wherein one of said oscillators comprises an oscillator for said controller means.

* * * * *